United States Patent [19]

Kawagoe

[11] 4,365,263

[45] Dec. 21, 1982

[54] SEMICONDUCTOR INTEGRATED CIRCUIT DEVICE COMPOSED OF INSULATED GATE FIELD-EFFECT TRANSISTOR

[75] Inventor: Hiroto Kawagoe, Hinode, Japan

[73] Assignee: Hitachi, Ltd., Tokyo, Japan

[21] Appl. No.: 141,574

[22] Filed: Apr. 18, 1980

Related U.S. Application Data

[63] Continuation of Ser. No. 634,772, Nov. 24, 1975, abandoned.

[30] Foreign Application Priority Data

Sep. 4, 1975 [JP] Japan ................................ 50/107350

[51] Int. Cl.³ ............................................ H01L 27/04
[52] U.S. Cl. ........................................ 357/45; 357/23
[58] Field of Search ....................... 357/23, 41, 45, 91, 357/23 R; 365/104, 182

[56] References Cited

U.S. PATENT DOCUMENTS

| 3,775,191 | 11/1973 | McQuhae | 357/41 X |
| 3,865,651 | 2/1975 | Arita | 357/41 X |
| 4,000,429 | 12/1976 | Yoshida et al. | 307/246 |

OTHER PUBLICATIONS

Kawagoe et al, "Minimum Size ROM Structure Compatible to Silicon Gate E/D MOS LSI", Conference Publication No. 130, *First European Solid State–Circuits Conference–ESSCIRC*, Sep. 2–5, 1975.

*Primary Examiner*—James W. Davie
*Attorney, Agent, or Firm*—Antonelli, Terry & Wands

[57] ABSTRACT

In a semiconductor integrated circuit device composed of insulated gate field-effect transistors, the improvement comprises the fact that insulated gate field-effect transistors having gate insulating films of substantially equal thicknesses are arranged on a principal surface of a semiconductor substrate in the shape of a matrix. Gate input columns of the transistors are formed of polycrystalline silicon layers, and some of the transistors are enhancement type, while others are depletion type. Further, the respective transistors are formed by the self-alignment technique which employs the polycrystalline silicon layers as a diffusion mask, and the depletion type transistors are formed by implanting impurity ions opposite in the conductivity type to the substrate into selected areas of the surface of the substrate. Thus, a read only memory in a MOS-IC chip has its occupying area reduced remarkably.

6 Claims, 22 Drawing Figures

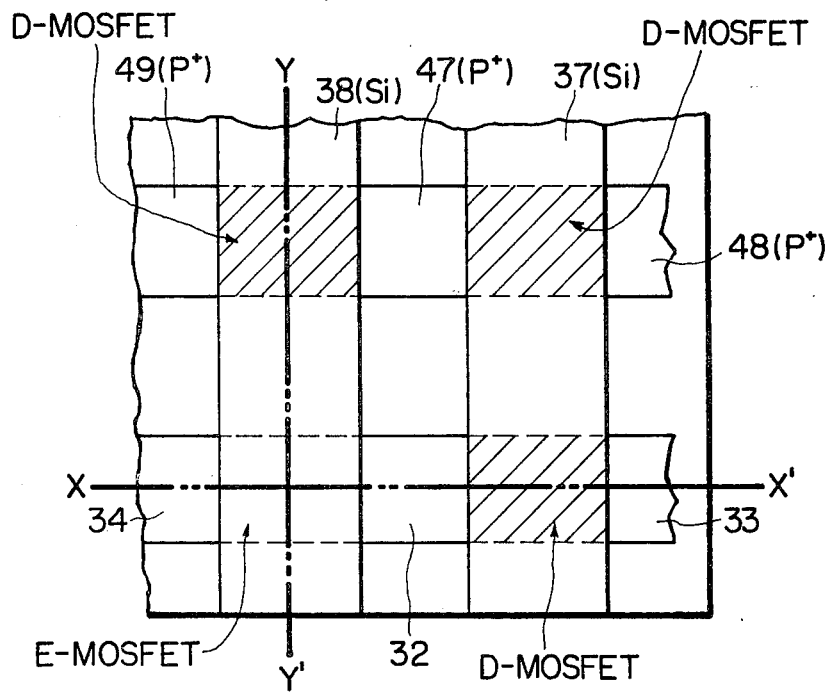
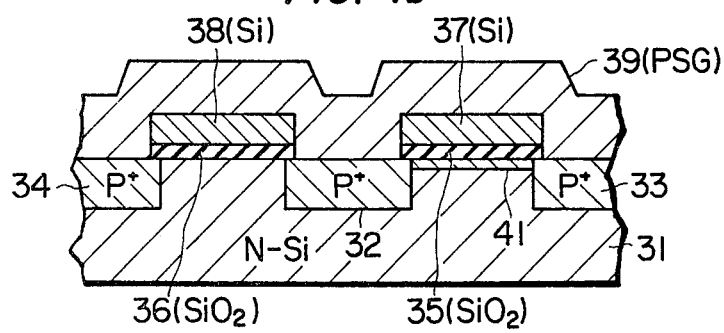
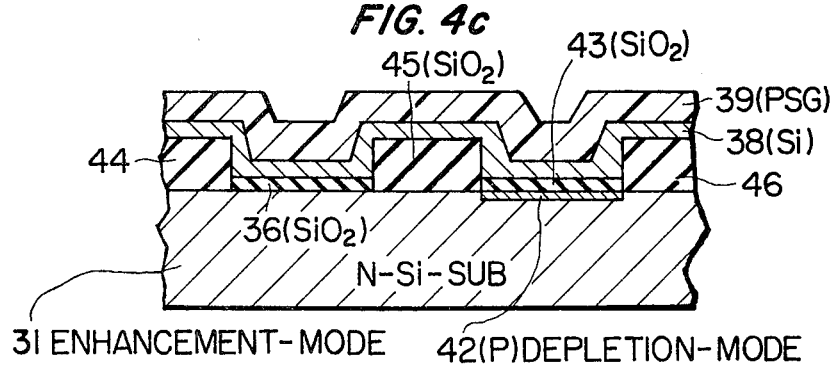

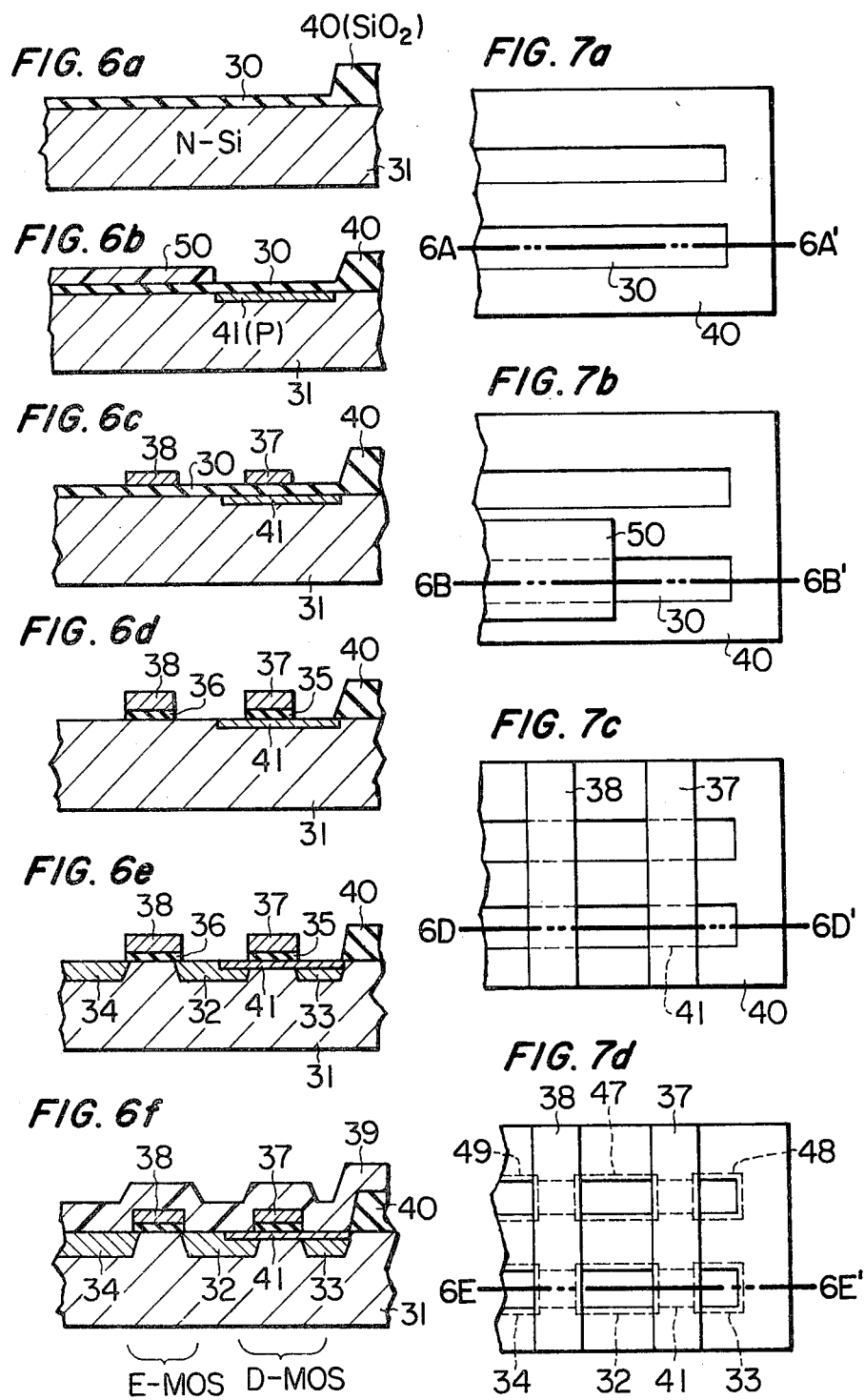

SEMICONDUCTOR INTEGRATED CIRCUIT DEVICE COMPOSED OF INSULATED GATE FIELD-EFFECT TRANSISTOR

This is a continuation of application Ser. No. 634,772 filed Nov. 24, 1975 now abandoned.

BACKGROUND OF THE INVENTION

1. Field of the Invention

This invention relates to an integrated circuit device composed of insulated gate field-effect transistors (hereinbelow term "MOSIC") and also to a method of manufacturing the same.

2. Description of the Prior Art

In general, a MOSIC uses aluminum or silicon as the material for the gate electrode. On the other hand, there are integrated circuits (IC) in which, in one internal circuit of an inverter stage, a load MOSFET of the enhancement type is employed as the load of a driving MOSFET operative in the enhancement mode (hereinafter called "E/E type IC") and there is an IC in which a load MOSFET of the depletion type is employed (hereinafter called "E/D type IC"). Among the ICs, the silicon gate MOSIC employing the depletion load has recently been extensively adopted as a device which is of higher performance for various uses and has a higher desnity of integration than the aluminum gate MOSIC. According to experiments by the inventor, the occupying area of an Si gate MOS transistor having self-aligned gate structure is reduced by approximately 20 to 30% as compared with that of an Al gate MOS transistor.

As a result of the investigation of MOSICs commercially available as produced by several manufacturers, however, it has been found that, in a read only memory (hereinbelow abbreviated to "ROM") which occupies a considerable part of a MOSIC chip, the size of the single bit of the ROM is not always remarkably smaller in the conventional Si gate ROM structure than in the Al gate one as indicated in the following Table 1:

TABLE 1

| IC manufacturer | Comparisons of ROM bit sizes | | type of IC |
|---|---|---|---|
| | Si gate ROM | Al gate ROM | |
| A | — $\mu m^2$ | 336 $\mu m^2$ | dynamic type |
| B | 616 | 650 | static type |
| C | 525 | — | static type |
| D | 412 | — | static type |
| E | 441 | 432 | static type |

SUMMARY OF THE INVENTION

It is, accordingly, a principal object of this invention to provide a novel ROM structure which has a conspicuously smaller occupying area than the prior art Al gate or Si gate ROMs, and a method of manufacturing such a novel ROM structure.

Another object of this invention is to provide an IC in which the occupying area of a ROM per unit function in the prior art MOSIC of the Si gate E/D type is conspicuously diminished, and a method of manufacturing such an IC.

BRIEF SUMMARY OF THE INVENTION

According to one aspect of this invention, there is provided a semiconductor integrated circuit device composed of insulated gate field-effect transistors characterized in that the insulated gate field-effect transistors having gate insulating films of substantially equal thicknesses are arranged on a principal surface of a semiconductor substrate in the shape of a matrix. Gate input columns of said transistors are formed of polycrystalline silicon layers, and some of the transistors are enhancement type, while others are depletion type.

BRIEF DESCRIPTION OF THE DRAWING

FIGS. 4a to 4c are enlarged plan and sectional views of a part of the MOSROM according to the invention, respectively;

FIGS. 6a to 6f and FIGS. 7a to 7d are enlarged sectional views and plan views of a part of the MOSROM according to the invention for explaining a manufacturing process of the MOSROM, respectively;

FIG. 9b is a diagram showing an example of a circuit in the case of actually employing the MOSROM of the invention, while

DETAILED DESCRIPTION OF THE PRIOR ART

Figure 1:
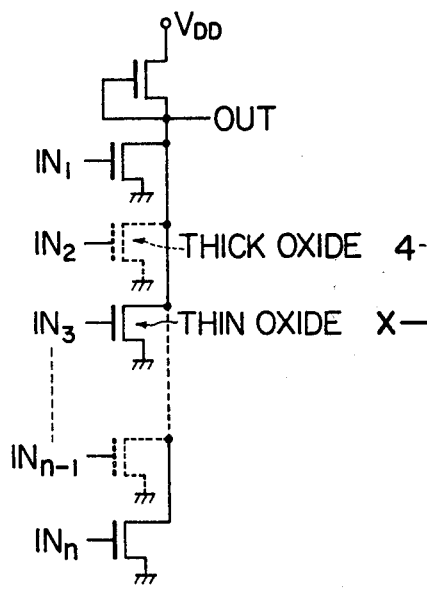
FIG. 1 is a fundamental circuit diagram of a prior art MOSROM.

Hereunder, the improved ROM (MOS matrix) according to the invention will be described in detail in comparison with a prior art Si gate ROM with reference to the drawing.

Figure 2A:
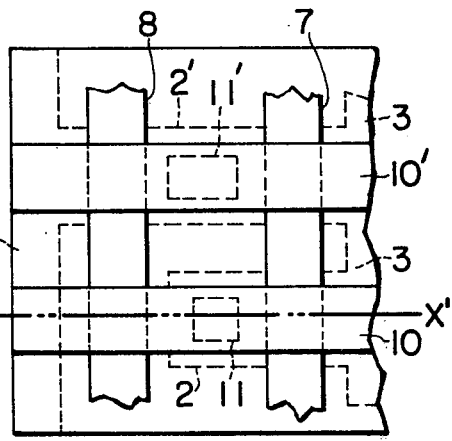
FIGS. 2a and 2b are enlarged plan and sectional views of a part of a prior art MOSROM, respectively.
Figure 2B:
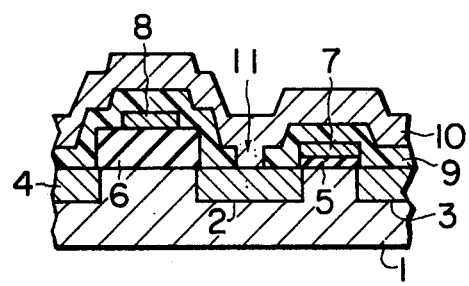

FIG. 1 shows a fundamental circuit which is used in the prior art Si gate ROM. FIG. 2a is a plan view showing a part of the prior art Si gate ROM on an enlarged scale, while FIG. 2b is a sectional view of the part of the prior art Si gate MOSROM taken along a line X—X' in FIG. 2a.

As is illustrated in FIG. 1, the prior art Si gate MOSROM consists of MOSFETs which are arranged in parallel. The states of the respective memory cells are segregated according to the thicknesses of their gate oxide films. A low level signal close to a supply voltage level is applied to a selected address line, whereas a high level signal close to 0 (zero) volts is applied to an unselected address line. Considering, by way of example, the case where a line $IN_2$ is selected, the MOSFET beneath this line has a thick gate oxide film and is usually "off", so that the output level becomes low. As is shown in FIGS. 2a and 2b, such a prior art ROM is constructed of P+-type diffused layers 2,3 and 4; polycrystalline silicon layers 7 and 8; silicon dioxide films 5 and 6; phosphosilicate glass 9; a through-hole 11; and an aluminum layer 10. The polycrystalline silicon layer is used as an address input line, while the aluminum layer is used as an output line. The through-holes between the Al layer and the P+-type diffused layers are necessary for commonly connecting the drain electrodes of the MOSFETs which are arranged at each row. As is apparent from the figures, the states of the memory cells at the points of intersection between the input lines and the output lines are determined by the thicknesses of the gate oxide films. More specifically, where a MOSFET which affects an "on-off" operation in response to signal voltages applied to the input line, required at a certain point of intersection, the gate oxide film beneath the polycrystalline Si layer at that place is made thin, while, where the MOSFET which conducts such operation is unnecessary thereat, the oxide film beneath the polycrystalline Si layer at that place is made thick. Thus, a ROM having a predetermined bit pattern is constructed. The minimum size per unit bit of the Si gate ROM of such a construction is about 410 $\mu m^2$, and it is substantially equal to that of the Al gate ROM.

As is described above, a conventional ROM is characterized by the following construction:

(1) The states of the respective memory cells are distinguished by the thicknesses of the gate oxide films.

(2) Since self-aligned gate structure is used, the polycrystalline Si layer cannot cross over the $P^+$-type diffused layer. Therefore, an Al wiring layer is necessary, and a through-hole is required between the $P^+$-type diffused layer and the Al layer.

Accordingly, the occupying area per bit of the prior art Si gate ROM cannot be made small, in spite of the adoption of self-aligned structure.

DETAILED DESCRIPTION OF THE INVENTION

The Si gate MOSROM according to this invention will now be explained with reference to FIGS. 3, 4a to 4c, and 5.

Figure 3:
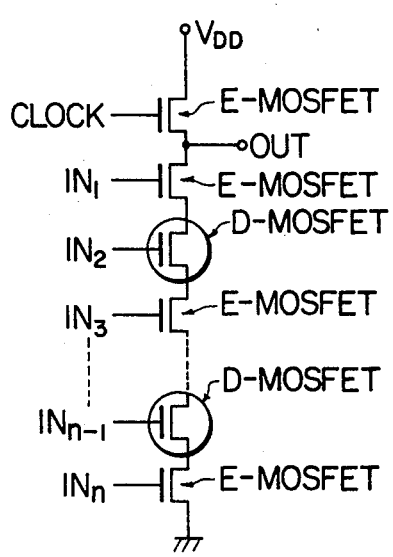
FIG. 3 is a fundamental circiuit diagram of a MOSROM according to the invention.

FIG. 3 shows a fundamental circuit which is employed in the ROM according to this invention. It is composed of a plurality of enhancement mode and depletion mode MOSFETs which are connected in series as driving elements. A depletion mode MOSFET functions also as a resistance element. Read-out is stably executed in such a way that a high level signal close to 0 (zero) volts is impressed on a selected address line. At this time, a low level signal is impressed on an unselected address line.

By way of example, where the address line $IN_2$ is selected, the MOSFET beneath this address line $IN_2$ turns "on", since it is a depletion mode MOSFET. Since the MOSFETs associated with the address lines $IN_1$, $IN_3$, ... and $IN_n$ are enhancement mode MOSFETs, they turn "on" by having a low level signal applied to their gates. Since the MOSFET associated with the address line $IN_{n-1}$ is a depletion mode MOSFET, it is "on" even when a low level signal is applied to its gate. In this case, accordingly, all the driving elements are substantially "on", so that an output signal of a high level close to 0 (zero) volts is produced at an output terminal OUT.

On the other hand, where the address line $IN_3$ is selected, the MOSFET associated with this line becomes nonconductive (off) in response to an input signal of high level since it operates in the enhancement mode. Therefore, an output signal of low level appears at the output terminal OUT.

As is apparent from the above explanation, in the ROM according to this invention, the output data line to be precharged is maintained at a low level or is shifted to a high level in dependence on whether an enhancement or a depletion mode MOSFET is addressed, respectively.

Figure 5:
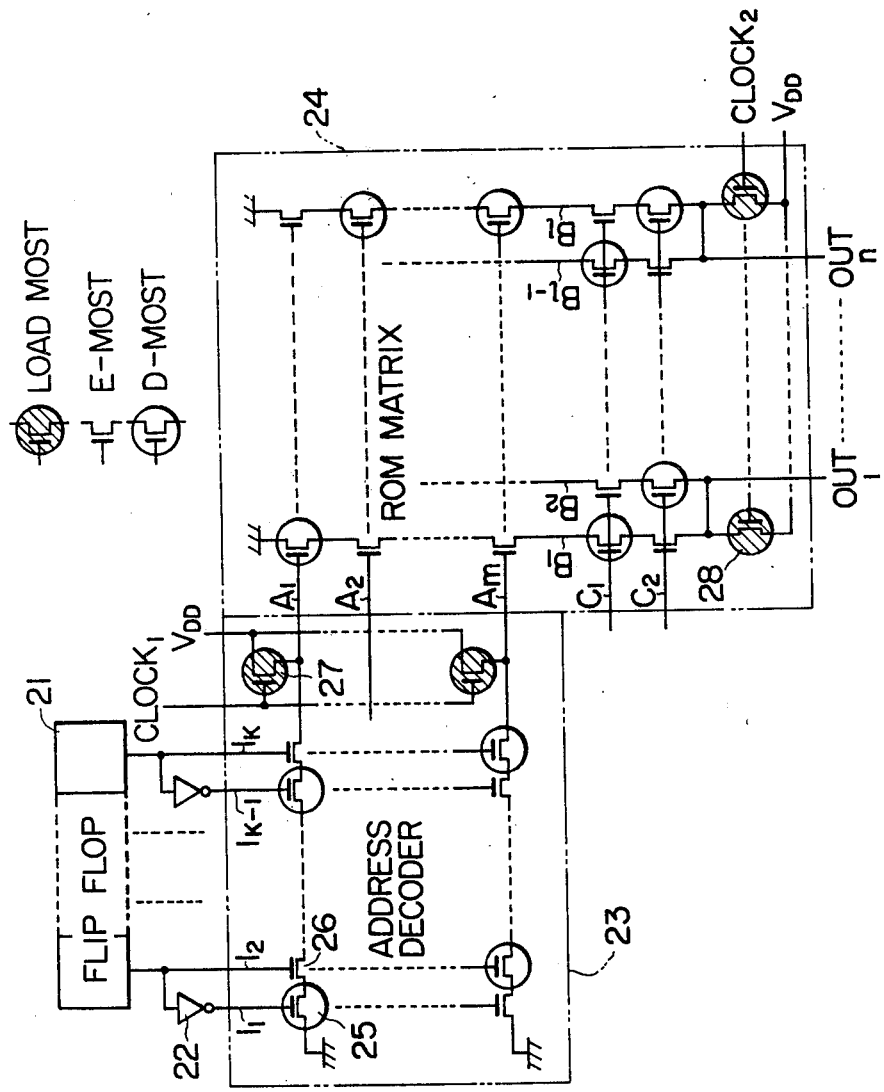
FIG. 5 is a diagram of an application circuit which adopts the MOSROM according to the invention.
Figure 8A:
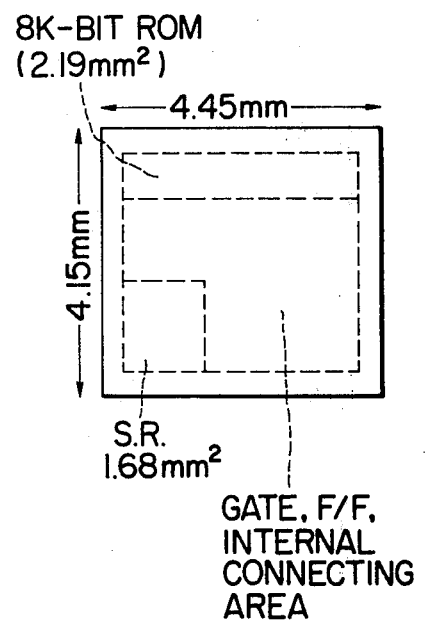
FIGS. 8a and 8b are top pattern diagrams of LSI chips of a MOSLSI adopting the invention and a MOSLSI fabricated by a prior art for making a comparison therebetween, respectively.
Figure 8B:
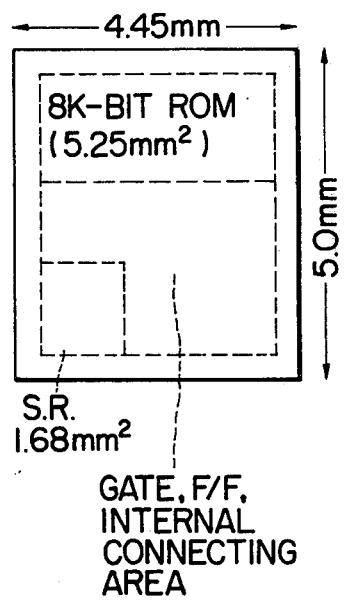
Figure 9A:
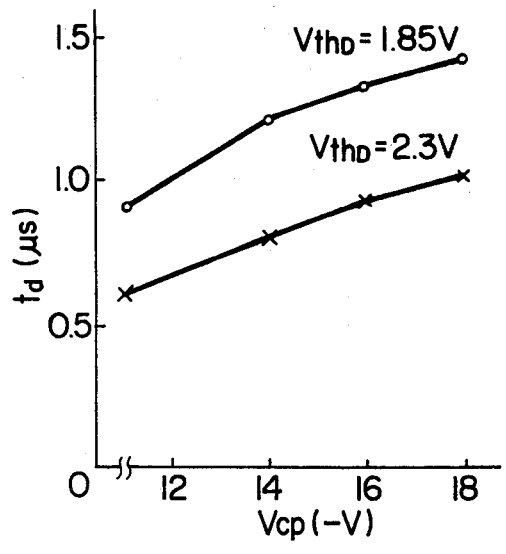
FIG. 9a is a graph showing the measured results of operating speeds in the circuit of FIG. 9b.
Figure 9B:
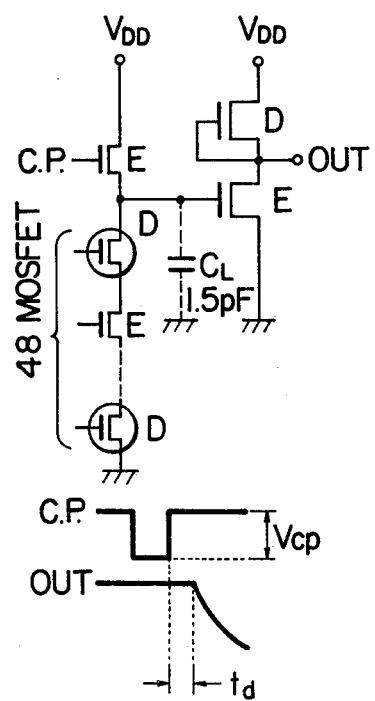

FIG. 5 shows a ROM circuit which is constructed by applying this invention to an actual MOSIC ROM on the basis of the fundamental circuit of the invention illustrated in FIG. 3, and which comprises a first address decoder MOS matrix and a second MOS matrix receiving an output of the first MOS matrix as its input. A flip-flop circuit 21 consists of a plurality of stages (for example, k/2 stages) connected in cascade. Outputs from the respective stages are delivered directly or through inverter circuits 22 into the first MOS matrix 23, whose outputs are delivered into the second MOS matrix 24. The second MOS matrix provides outputs OUT 1 to OUT n. The matrices 23 and 24 have one MOSFET operative in the depletion or enhancement mode in any of the places in which input lines and output lines intersect. Such FETs are connected in series between a supply voltage $V_{DD}$ and a reference potential source (earth) at every column. Connected to the respective matrices as loads of the driving MOSFETs are enhancement mode MOSFETs (27,28) which have clock signals applied to the gates thereof. In the figure, the driving MOSFETs with circles as indicated at 25 are those operating in the depletion mode, while the other driving MOSFETs are those operating in the enhancement mode.

Each of the plurality of inverters 22 consists of a driving MOSFET which operates in the enhancement mode, and a load MOSFET which is connected in series therewith and which operates in the depletion mode. As will be described later, all the MOSFETs in the figure have gate insulating films (for example, $SiO_2$ films) of substantially equal thicknesses (about 500 to 1,500 angstrom) irrespective of whether they are depletion type or enhancement type. The depletion type MOSFETs in the MOS matrices are formed simultaneously with the depletion type MOSFETs in the inverters 22 by the same process. The input lines of the first and second matrices are formed of polycrystalline silicon wiring layers, while the connection from the output line of the first matrix to the input line of the second matrix is effected by the use of an aluminum wiring layer which connects a $P^+$-type diffused layer and the polycrystalline Si layer. When FIG. 5 is studied with reference to FIG. 3, the operation of the circuit in FIG. 5 will be self-explanatory. To be particularly mentioned is that clock pulses $\phi_1$ and $\phi_2$ whose phases differ from each other are impressed on the gates of the load MOSFETs in the first and second matrices, respectively, and that the amplitudes of these pulses (for example, $-12$ to $-16$ volts) are greater than the amplitude of the supply voltage $V_{DD}$ (for example, $-6$ volts).

Referring now to FIGS. 4a to 4c, the device structure of the MOSROM according to this invention will be described. FIG. 4a is a plan view with a part of the MOSROM enlarged, while FIGS. 4b and 4c show X—X' and Y—Y' sections in FIG. 4a, respectively. In the figures, numeral 31 designates an N-type single crystal Si substrate; numerals 32 to 34 and numerals 47 to 49 are $P^+$-type diffused layers which are formed by being self-aligned by Si gate electrodes; numerals 35, 36, and 43 are gate insulating films of silicon dioxide which have essentially equal thicknesses (about 1,000 Å); numerals 37 and 38 are input lines of polycrystalline Si; numeral 39 is an insulating film of phosphosilicate glass; numerals 41 and 42 represent P-type channel layers which are formed by implanting P-type impurity ions into selected areas of the surface of the substrate in order to form the depletion MOSFETs; and numerals 44 to 46 are field insulating films of silicon dioxide which are comparatively thick (about 1 to $2\mu$). As is apparent from the figures, one memory cell is formed in ions are again implanted into the substrate surface 1. A semiconductor integrated circuit matrix device having a plurality of insulated gate field effect transistors arrayed along rows and columns comprising:
   (a) a semiconductor substrate having a first conductivity type;
   (b) a plurality of semiconductor regions having a second conductivity type opposite to said first conductivity type formed in said semiconductor substrate and arrayed along said each row;
   (c) gate insulated films each formed on the surface of the portion of said semiconductor substrate between said adjacent semiconductor regions in each row, all of said gate insulating films in respective rows having substantially equal thickness;
   (d) a field insulating film formed on the surface of said semiconductor substrate, defining said semiconductor regions and said gate insulating films the thickness of said field insulating film being greater than that of said gate insulating film;
   (e) a plurality of conductive strips formed along said respective columns, each conductive strip being arranged on said gate insulating films in each column thereby defining respective insulated gate field effect transistors at all of those respective portions of said gate insulating films crossed over by said conductive strips; and
   (f) ion-implanted regions having said second conductivity type formed in selected ones of said portions overlaid by said gate insulating films, and a portion of said ion-implanted regions being self-aligned by said field insulating film, whereby said ion-implanted regions act as the channel regions of depletion type field effect transistors, respectively, while the others of said portions overlaid by said gate insulating films act as the channel regions of enhancement type field effect transistors, respectively, and; wherein each of said conductive strips is coupled to receive first and second signal voltage levels, so that each of said enhancements type field effect type transistors is turned on and off by said first and second signal voltage levels, respectively, and each of said depletion type field effect transistors is normally on irrespective of said signal voltage levels.

2. A semiconductor read only memory circuit device having a plurality of insulated gate field effect transistors arranged along rows and columns comprising:
   (a) a semiconductor substrate having a first conductivity type;
   (b) a plurality of semiconductor regions having a second conductivity type opposite to said first conductivity type formed in said semiconductor substrate and arrayed along said each row;
   (c) gate insulating films each formed on the surface of the portion of said semiconductor substrate between said adjacent semiconductor regions in each row;
   (d) a field insulating film formed on the surface of said semiconductor substrate, defining said semiconductor regions and said gate insulating films, the thickness of said field insulating film being greater than that of said gate insulating film;
   (e) a plurality of conductive strips formed along said respective columns, said each conductive strip being arranged on said gate insulating films in each column;
   (f) other semiconductor regions having said second conductivity type formed in selected ones of said portions overlaid by said gate insulating films, and a portion of said other semiconductor regions being defined by said field insulating film, whereby said other semiconductor regions act as the channel regions of depletion type field effect transistors, respectively, while the others of said portions overlaid by said gate insulating films act as the channel regions of enhancement type field effect transistors, respectively;
   (g) first connection means for connecting said semiconductor region located at first sides of respective rows with output terminals which derive output signals of the series circuits of said insulated gate field effect transistors in respective rows; and
   (h) second connection means for commonly connecting said semiconductor regions located at second side of respective rows to a reference potential.

3. A semiconductor read only memory circuit device according to claim 2, further comprising:
   a conductive line for providing a power supply; and enhancement type insulated gate field effect transistors connected between said conductive line and said first connection means.

4. A semiconductor integrated circuit matrix device containing a plurality of insulated gate field effect transistors some of which are enhancement mode field effect transistors and some of which are depletion mode field effect transistors comprising:
   a semiconductor substrate of a first conductivity type;
   a plurality of field insulating films disposed on the surface of said substrate and arranged thereon so as to be spaced apart from and parallel with one another in a first prescribed direction, and thereby define a plurality of parallel stripe-shaped surface portions of said substrate therebetween;
   a plurality of ion-implanted regions of a second conductivity type opposite to said first conductivity type, formed in selected regions of said stripe-shaped surface portions of said substrate, with a pair of opposite sides of a respective region being defined by edges of those ones of said field insulating films between which a respective stripe-shaped surface portion of said substrate, in which said respective region is formed, is defined;
   gate insulating films each having the same thickness formed on prescribed regions of said stripe-shaped surface portions including said selected regions and including regions therein other than said selected regions, and being contiguous with said field insulating films;
   a plurality of conductive strips arranged in parallel with one another and extending along a second prescribed direction substantially orthogonal to said first direction and being disposed on said gate insulating films; and
   said plurality of semiconductor regions of a second conductivity type, opposite to said, formed in said stripe-shaped surface portions of said substrate between said prescribed regions thereof; and wherein
   the thickness of each field insulating film is greater than the thickness of said gate insulating films and wherein the width of a respective field insulating film is constant along the length thereof adjacent to said prescribed regions and ones of said plurality of semiconductor regions.

5. A semiconductor integrated circuit device according to claim 4, wherein said conductive strips are disposed on said field insulating films.

6. A semiconductor integrated circuit device according to claim 4, wherein depletion mode field effect transistors are formed at said selected regions and enhancement mode field effect transistors are formed at said regions other than said selected regions.

* * * * *